United States Patent

Grobman et al.

[19]

[11] Patent Number: 6,106,567

[45] Date of Patent: Aug. 22, 2000

[54] CIRCUIT DESIGN VERIFICATION TOOL AND METHOD THEREFOR USING MAXWELL'S EQUATIONS

[75] Inventors: Warren D. Grobman; Mark H. Nodine, both of Austin, Tex.

[73] Assignee: Motorola Inc., Schaumburg, Ill.

[21] Appl. No.: 09/069,028

[22] Filed: Apr. 28, 1998

[51] Int. Cl.$^7$ .................................................. G06F 17/50
[52] U.S. Cl. ................................. 716/5; 703/14; 703/15
[58] Field of Search .................... 395/500.06, 500.35, 395/500.36; 716/5; 703/14, 15; 333/33, 161

[56] References Cited

U.S. PATENT DOCUMENTS

| | | | |
|---|---|---|---|
| 5,243,547 | 9/1993 | Tsai et al. ............................ | 395/500.35 |
| 5,379,231 | 1/1995 | Pillage et al. ....................... | 395/500.35 |
| 5,615,137 | 3/1997 | Holzmann et al. ................. | 395/500.38 |
| 5,905,883 | 5/1999 | Kasuya ................................ | 395/500.38 |
| 5,920,711 | 7/1999 | Seawright et al. ................. | 395/500.36 |
| 5,966,306 | 10/1999 | Nodine et al. ....................... | 710/113 |

OTHER PUBLICATIONS

Poltz, J., "Determining Noise Levels in VLSI Circuits," IEEE International Symposium on Electromagnetic Compatibility, 1993, pp. 340–345, Aug. 1993.

Kim, S.Y., Tuncer, E., Gupta, R., Krauter, B., Savarino, T., Neikirk, D.P., and Pillage, L.T., "An Efficient Methodology for Extraction and Simulation of Transmission Lines for Application Specific Electronic Modules," IEEE/ACM International Conference on Nov. 1993.

Gupta, R., Seok–Yoon Kim, and Pillage, L.T., "Domain Characterization of Transmission Line Models for Efficient Simulation," Proceedings of the IEEE International Conference on Computer Design: VLSI in Computers and Processors, 1994, pp. 558–562, Oct. 1994.

Beker, B., Cokkinides, G., and Templeton, A., "Analysis of Microwave Capacitors and IC Packages," IEEE Transactions on Microwave Theory and Techniques, vol. 42, No. 9, Sep. 1994, pp. 1759–1764, Sep. 1994.

Smedes, T., van der Meijs, N.P., and van Genderen, A.J., "Extraction of Circuit Models for Substrate Cross–talk," Proceedings of the IEEE/ACM International Conference on Computer–aided Design, 1995, pp. 199–206, Nov. 1995.

Kamon, M. and Majors, S.S., "Package and Interconnect Modeling of the HFA3624, a 2.4 GHz RF to IF Converter," Proceedings of the 33rd Annual Conference on Design Automation, 1996, pp. 2–7, Jun. 1996.

van der Meijs, N.P., and Smedes, T., "Accurate Interconnect Modeling: Towards Multi–million transistor Chips as Microwave Circuits," Proceedings of the IEEE/ACM International Conference on Computer–aided Design, 1996, pp. 244–251, Nov. 1996.

Jong–Gwan Yook, Katehi, L.P.B., Sakallah, K.A., Martin, R.S., Huang, L., and Schreyer, T.A., "Application of System–Level EM Modeling to High–speed Digital IC Packages and PCB's," IEEE Transactions on Microwave Theory and Techniques, vol. 45, No. 10, p. 1, Oct. 1997.

Chiprout, E., "Hierarchical Interconnect Modeling," Technical Digest of the International Electron Devices Meeting, 1997, pp. 125–128, Dec. 1997.

*Primary Examiner*—Paul R. Lintz
*Assistant Examiner*—Vythe Siek
*Attorney, Agent, or Firm*—James L. Clingan, Jr.

[57] ABSTRACT

Very high speed circuits are adversely effected by parasitic capacitances and line resistances. At high speeds these values of capacitance and resistance change with frequency. A method of verification of the design of high speed circuits includes a simulation of the effects of these changes in resistance and capacitance which occur at high frequency. There is a logic component and a physical-layout component which are combined to provide a full simulation of the circuit taking into account these effects which occur at very high frequency. The physical-layout component utilizes Maxwell's equations in their entirety without removing the time dependent effects. One embodiment considers only cases defined by the bus protocol, reducing the computational penalty of complete electromagnetic simulation.

23 Claims, 2 Drawing Sheets

CIRCUIT DESIGN VERIFICATION TOOL AND METHOD THEREFOR USING MAXWELL'S EQUATIONS

INCORPORATED BY REFERENCE

The following patent is incorporated by reference: "Method for Verifying Protocol Conformance of an Electrical Interface" by Mark Nodine, et al., having application Ser. No. 5,966,306, filed on Jul. 7, 1997, and assigned to the assignee hereof, issued Oct. 12, 1999.

1. Field of the Invention

The present invention relates generally to integrated circuits, and specifically to verification of signal integrity for high frequency operation.

2. Background of the Invention

Recent trends tend toward using a communication bus within a system for communication between various chips. A further evolution of this trend is the design of semiconductor chips which incorporate an internal bus for communication between various internal modules. Applications include data processing systems, telecommunications systems, etc. A communication bus may be described by a protocol, which defines operation of the bus. In circuit design it is desirable to verify the circuit will perform within the protocol constraints. Many methods have been developed for such verification.

Typical verification methods employ some type of logical simulation. Logic simulation is performed independently from physical analysis of the circuit. As buses are used to interface with more and more modules, the effects of crosstalk, substrate return currents, and other interconnection effects become significant. There is a need to verify both the logical function and the physical function of a circuit.

Analysis of the physical-layout-related electromagnetic effects of a circuit are often impractical due to computational inefficiency. In order to solve the equations associated with these effects, it is necessary to employ large-scale computational efforts, which are not readily available to the circuit designer. Additionally, typical electromagnetic distortion effects have been performed over a very large range of possible outcomes. This adds to the complexity of the analysis.

There is a need for an efficient and accurate method of verifying bus protocol and circuit design which incorporates not only a logical simulation but also verifies the physical-layout-based electromagnetic behavior.

DETAILED DESCRIPTION OF THE PREFERRED EMBODIMENT(S)

Figure 1:
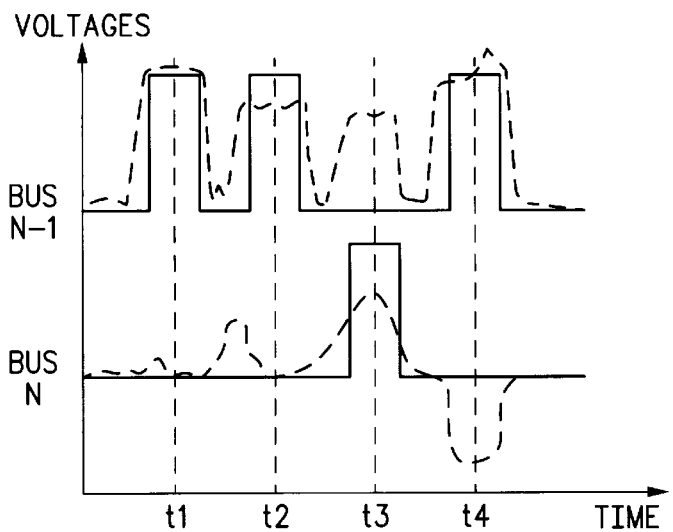
FIG. 1 illustrates in graphic form a comparison of logical pattern generation and actual physical output.

In the following description, numerous specific details are set forth such as specific control register bit lengths, etc. to provide a thorough understanding of the present invention. The term "bus" will be used to refer to a plurality of signals or conductors which may be used to transfer one or more of various types of information, such as data, addresses, control, or status. The terms "assert" and "negate" will be used when referring to the rendering of a signal, status bit, or similar apparatus into its logically true or logically false state, respectively. If the logically true state is a logic level one, the logically false state will be a logic level zero. If the logically true state is a logic level zero, the logically false state will be a logic level one.

According to one aspect of the present invention, a method for verifying circuit design, where the integrated circuit has a predetermined layout and a protocol, involves obtaining a physical description of the predetermined layout of the circuit; selecting an electromagnetic model which includes at least one of inductive effects and substrate currents effects; providing a simulator which provides a signal simulation of the predetermined layout based on the electromagnetic model; obtaining a logic simulation of the circuit and providing an output representative of the logic simulation to the simulator; providing a fully simulated signal from the simulator; providing a protocol reference model representative of the protocol; and comparing the protocol reference model to the fully simulated signal.

A method of manufacturing an integrated circuit utilizing this method of verification further includes designing the integrated circuit to include the circuit having the predetermined layout; fabricating a set of masks for the integrated circuit which includes the circuit which has the predetermined layout; and fabricating the integrated circuit in conjunction with the set of masks. According to one embodiment, the electromagnetic model includes time-dependent portions of Maxwell's equations.

According to another aspect of the present invention, a method for verifying that an electrical interface circuit having a predetermined layout complies with a protocol, includes obtaining a physical description of the predetermined layout of the electrical interface circuit; performing a logic simulation of the electrical interface circuit to produce a Boolean output; applying an electromagnetic model that includes at least one of inductive effects and substrate current effects to the Boolean output and to the predetermined layout of the electrical interface circuit to produce a fully simulated signal; providing a protocol reference model representative of the protocol; and comparing the protocol reference model to the fully simulated signal. According to one embodiment, the Boolean output is limited to a number of patterns which is a subset of all possible Boolean combinations. According to another embodiment, the electromagnetic model is based on Maxwell's equations. According to still another embodiment, the electromagnetic model includes time-dependent portions of Maxwell's equations. The electromagnetic model may utilize closed-form approximations to Maxwell's equations corresponding to a regime of operation. The electromagnetic model may utilize finite-difference time-domain computations.

According to still another aspect of the invention, a method for verifying that an electrical interface circuit having a predetermined layout provides valid logic signals, includes obtaining a physical description of the predetermined layout of the electrical interface circuit; performing a logic simulation of the circuit to produce a Boolean output; applying an electromagnetic model that includes at least one of inductive effects and substrate current effects to the Boolean output and to the predetermined layout of the electrical interface circuit to produce a fully simulated signal, wherein the electromagnetic model includes inductive effects; and comparing the Boolean output to the fully simulated signal.

According to another aspect of the present invention, a method of making an integrated circuit, includes designing the integrated circuit and including therein an electrical interface circuit with a predetermined layout; obtaining a physical description of the predetermined layout of the electrical interface circuit; performing a logic simulation of the electrical interface circuit to produce a Boolean output; applying an electromagnetic model that includes at least one of inductive effects and substrate current effects to the Boolean output and to the predetermined layout of the electrical interface circuit to produce a fully simulated signal; providing a protocol reference model representative of the protocol; comparing the protocol reference model to the fully simulated signal; fabricating a set of masks according to a design of the integrated circuit which includes the electrical interface circuit; and fabricating the integrated circuit in conjunction with the set of masks.

In one embodiment, computer software for verifying that an electrical interface circuit which has a predetermined layout complies with a protocol, includes a set of instructions for performing a logic simulation of the electrical interface circuit to produce a Boolean output; a set of instructions for applying an electromagnetic model that includes at least one of inductive effects and substrate current effects to a layout of the electrical interface circuit to produce a fully simulated signal in response to the Boolean output; and a set of instructions for comparing a protocol reference model representative of the protocol to the fully simulated signal. A computer readable medium may contain the computer software encoded in a machine readable format.

FIG. 1 illustrates signals propagated on adjacent lines of a bus in a semiconductor circuit. The bus has N conductors or wires, which may be used for communication or data transfer within the circuit. The first bus conductor is labeled "N−1" and the second bus conductor is labeled "N." Signal propagation on conductor N induces electromagnetic effects on conductor N−1. Similarly, signal propagation on conductor N−1 induces electromagnetic effects on conductor N. The electromagnetic effects may result in a distorted signal being propagated on the other conductor. The effective distortion is not limited to adjacent conductors, but may have far reaching effects throughout the circuit. Additionally, the effects may have a cumulative result, where the overlapping of circuitry magnifies the problem.

Referring to FIG. 1, the desired signal is indicated by a solid line, while the actual physical signal is indicated by the dashed line. The desired signal may be a logical output of a circuit simulation tool. Note that the actual physical signal does not exactly match the desired signal. The difference between the desired and actual physical signals is introduced by capacitive and inductive effects of coupling and the interaction of signals within the circuit. In the actual physical configuration there will be effects introduced between the conductors based on the signals and patterns of signals that each conductor experiences. An isolated conductor will also demonstrate similar effects. Distortion is the difference between the desired signal and the actual physical signal.

As an example, at time t1 the desired signal on conductor N is at a logical low and the desired signal on conductor N−1 is at a logical high level. Both conductor N and conductor N−1 experience distortion. While there is noticeable distortion on conductor N−1, there is only a slight coupling effect from the signal on conductor N. At time t2, the desired signal on N is again low and the desired signal on line N−1 is high. At time t2 the distortion experienced on line N is greater than at time t1. This may be due to the pattern of the signal on line N−1 or may be due to substrate currents, inductive effects, or the like. At time t3, the signals change polarity where conductor N−1 is low and conductor N is high. At time t3 there is a significant coupling effect as evidenced by increased distortion on both line N and line N−1. The actual physical signal on bus line N−1 at time t3 is at a logical high level, which violates the signal integrity on conductor N−1. Also, at time t3 the signal on bus conductor N is affected, degrading the voltage to a lower level. The coupling effect is most significantly visible at time t4, where bus conductor N−1 is at a high level and bus conductor N, which is intended to be a low level, is actually at a negative voltage level. These results are a consequence of a physical capacitance and inductance coupling within the circuit. Such physical effects are determined by the physical design and application of the circuit. The patterns illustrated in FIG. 1 propagated on lines N and N−1 are illustrative, and any number of varieties of patterns may introduce similar distortive effects.

Figure 2:
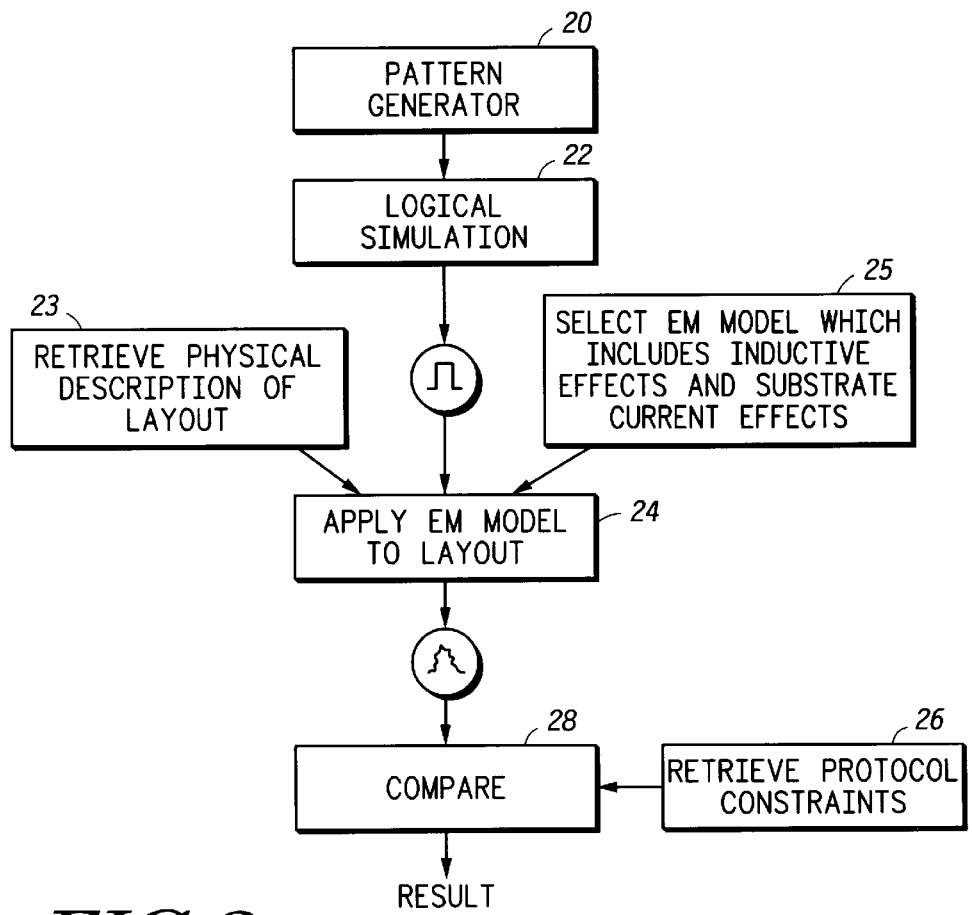
FIGS. 2 and 3 illustrate operation of a design verification tool according to one embodiment of the present invention.

In reference to FIG. 2, operation of a design verification tool is illustrated. The verification tool is used to verify a circuit design, where the circuit includes a bus, and the bus has an operating protocol. The protocol defines operation of the bus, and communication over the bus is limited to operation within the bus protocol. Bus protocol indicates how signals are to be propagated accross the bus. A typical system will contain multiple busses, where different busses may have different bus protocols.

Buses are inherently difficult to verify functionally because they usually contain a large number of signals. Many of these signals are bi-directional, so the possibility of a conflict due to poorly timed interface units is probabilistically quite large. Counting all the address, data, and control signals, it is not unusual for a modern bus to have 100 or more bits of information. Considering the state space for the bus to be the Cartesian product of the states of the individual bits that compose it and the internal protocol state machines of all the agents that connect to it, it is obvious that trying to verify a bus by doing a complete state space search is untenable. Even viewing the address and data buses as representing a single state, the remaining state space is still impracticably large. It is therefore necessary to have a formal methodology for bus protocol verification that limits the testing to those states that are realizable within the protocol space.

One of the problems faced by the designer of a hardware chip or board is ensuring that devices attached to a bus conform to the bus protocol, where a bus is a set of signals that must be driven according to a specifiable protocol in order to achieve a desired result. Commonly, buses are used for transferring data, and the protocol specifies how read and write transactions may occur on the bus. The typical way a bus interface controller is verified is to create a behavioral model that exercises all supported transactions across the bus. If the operation is completed without hanging the bus, it has passed the first level of test. A second level of test would then perform data compares of data written to a specific memory or address space. A third level of test would further include register read/write operations to check the integrity of the bus interface controller's registers. This strategy only checks to see if the bus is functional and does not verify compliance to the protocol. Further, typical methods of bus verification do not address the electromagnetic effects existing in the actual physical circuit. To this end, the present invention provides a method of more accurately verifying the circuit design including the actual physical effects occurring at those states actually defined in the bus protocol.

Returning to FIG. 2, the verification process generates patterns to simulate operation of the bus within the bus protocol. Each pattern represents an event that is to occur on the bus. The process verifies that the designed circuit and layout will not violate bus protocol constraints. Block 20 corresponds to the pattern generation which provides stimulus to the logical circuit model for logical simulation at block 22. The stimuli are intended to verify that the circuit design will perform within the protocol constraint space. Typically, generated patterns form a subset of all possible patterns, where the subset covers all of the events within the protocol constraint space. The stimuli are provided for logical simulation, as indicated by block 22, and a logical output of the circuit is produced. The logical simulation output is not a distorted signal, but corresponds to the desired signal of FIG. 1. The logical simulation allows the designer to verify that the circuit as designed will perform according to the protocol constraints. The logical simulation does not consider the electromagnetic effects introduced into the circuit by the physical-layout of the design.

The logical output of the circuit model provided by logical simulation is applied to an EM model, indicated by block 24, in combination with information which physically describes the circuit layout. The physical description of the layout is retrieved from the design data base, as indicated by block 23. The process selects an EM model, as indicated by block 25, where the model includes inductive and any other effects described by the complete form of Maxwell's equations in which electric and magnetic fields are coupled. In one embodiment, the model includes substrate current effects, which cause signal distortion, and includes other parasitic currents, which may be introduced by imperfect dielectrics, etc. The EM model is effectively applied to the physical description of the layout and simulates the response of the circuit to the output of logical simulation from block 22. In this way, a logical simulation is done to determine the logical output of the circuit, and then a physical simulation is done which includes signal distortions introduced due to electromagnetic effects which respect the boundary conditions described by the layout.

Referring again to FIG. 2, at block 28 the physical simulation output, as indicated from block 24, is verified against the protocol constraints, indicated by block 26. Protocol constraints define a protocol space within which the bus is permitted to operate. Signal integrity is a measure of conformity to the protocol. A signal integrity violation is defined as a logical or physical output which violates these constraints. The verification process indicates whether the circuit design will result in protocol constraint violations or not. According to one embodiment of the present invention the protocol constraints create a self-limiting group of test conditions. In this case, the comparison indicated by block 28 recognizes the event to occur on the bus and applies the corresponding protocol constraints. For example, where the pattern generator provides the stimulus for a STORE instruction, the bus is to operate according to a protocol specific to the STORE instruction. This will involve the generation and receipt of control signals, timing signals, address and data information according to a predefined sequence. The comparison involves retrieving the protocol constraints associated with the STORE instruction and comparing the physical simulation output against those constraints. The comparison, indicated by block 28, will catch those violations introduced by logical errors in the circuit design and those introduced by EM distortions. According to an alternate embodiment of the present invention, the step of retrieving protocol constraints, as in block 26, may include receiving information from pattern generator of block 20 and determining the protocol constraints associated with that information.

Figure 3:
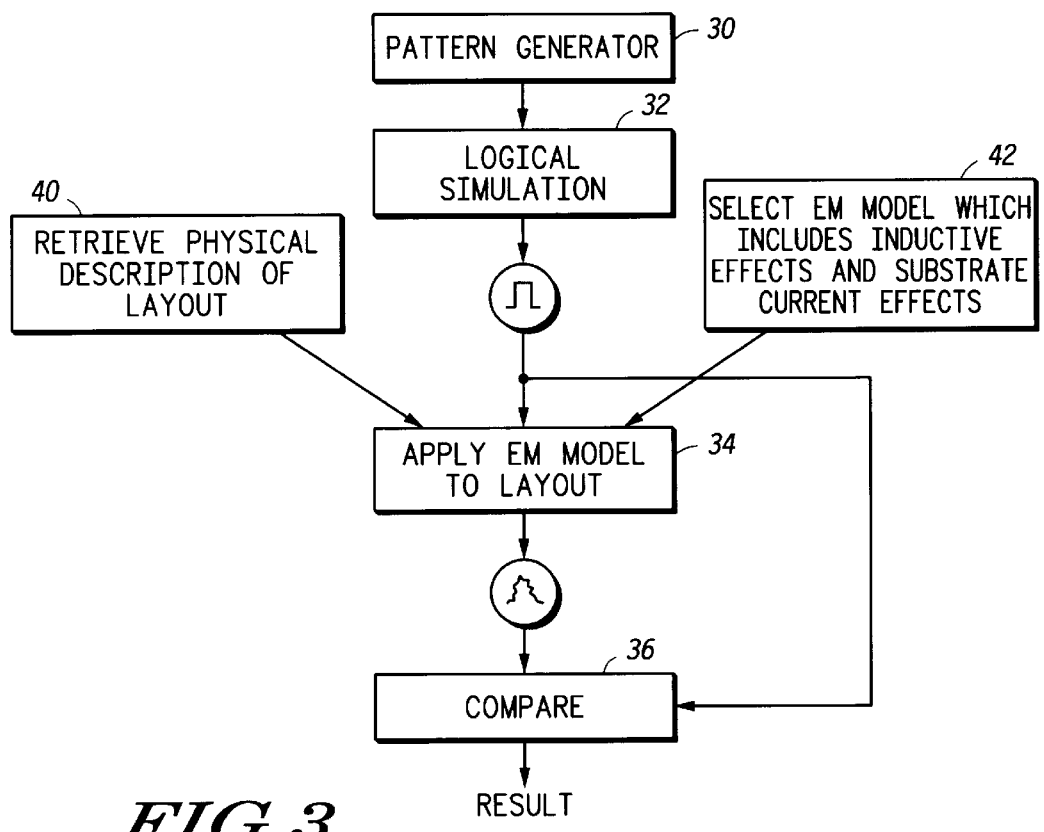

In reference to FIG. 3, a circuit design verification method is illustrated which effectively compares the logical simulation output to the physical simulation output. Again a pattern is generated and stimulus provided for logical simulation of the logical circuit model at block 30. Here the reference used for comparison in block 36 is the logical output of logic simulation, as indicated by block 32. The output of logical stimulation is then provided as a logical input for stimulus for physical simulation, as indicated by block 34. The logical output of block 32 is provided as the reference signal for comparison, as indicated by block 36.

The logical output of the circuit model provided by logical simulation is applied to an EM model, indicated by block 34, in combination with information which physically describes the circuit layout. The physical description of the layout is retrieved from the design data base, as indicated by block 40. The process selects an EM model, as indicated by block 42, where the model includes inductive and other effects, as described above. The EM model is effectively applied to the physical description of the layout and simulates the response of the circuit to the output of logical simulation from block 32. In this way, a logical simulation is done to determine the desired logical output of the circuit, and then a physical simulation is done which includes signal distortions introduced due to the layout. In this case the circuit has been designed to operate within a protocol space. The logic simulation performed as indicated by block 32 consequently limits the number of possible outcomes. By reducing the number of outcomes that are to be compared, an EM model which may be computationally costly may still be efficiently applicable to design verification. The verification method of FIG. 3 does not perform a logical verification of the design, but rather assumes the logical simulator guarantees compliance with the protocol.

Semiconductor devices are composed of complicated networks of conductors, devices, and interconnects. The cross effects of the elements of the network often impair the operation of the semiconductor device. In designing a semiconductor circuit it is important to consider these effects. As the frequency of operation increases, circuit operation becomes more sensitive to these interconnection effects. Electromagnetic (EM) effects of the interconnections and interactions within a circuit typically involve extremely time-consuming and cumbersome computation. EM simulations involve the use of Maxwell's Equations to describe the behavior of electromagnetic fields induced by a stimulus. The stimulus is applied to a particular layout and is defined by a corresponding set of physical boundary conditions and physical parameters. The physical boundary conditions describe the geometric definition of the circuit layout. Physical parameters include the resistivity of the conductor and substrate, the dielectric constant between conductors, and the mobility of carriers in the substrate.

Figure 4:
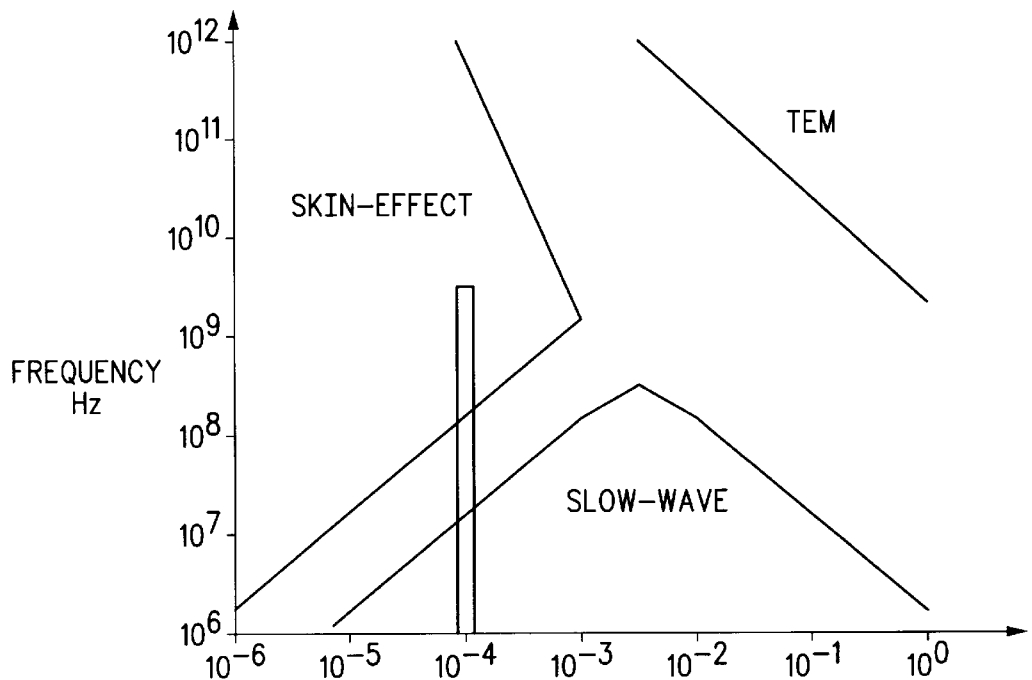
FIG. 4 illustrates a plot of electromagnetic regimes.

FIG. 4 illustrates the mathematical space defined by substrate resistivity vs. operating frequency of the circuit. The space is divided into regions, called regimes. Regimes indicate areas within which a pure sine wave will propagate with a particular characteristic delay or attenuation. The substrate resistivity is defined by the processing technology, and may be affected by the circuit design. At a given resistivity, each propagated signal may be decomposed into its Fourier components. Different frequency components of a given signal will propagate differently, causing distortion of the wave form. Decomposition of a signal into its Fourier frequency components allows for accurate simulation signal propagation in a particular circuit design.

Regimes associated with a semiconductor wafer are illustrated in FIG. 4. A first regime is labeled skin-effect, where operation within those frequencies result in only near surface currents in the conductors within the circuit. The slow-wave regime is dominated by substrate return current effects. The transverse electromagnetic (TEM) regime produces only slight distortions to signal propagation, and is therefore simulated with efficient, closed-form models. The region between these three regimes is referred to as a "gray" area, where simulation involves complicated solutions to Maxwell's Equations. The solutions in this region may not be representable as computationally efficient closed-form models. The gray areas introduce a complication into the physical simulation of a circuit. The computational effort of simulation of signals having frequency components within the TEM regime are considerably simpler than for signals having frequency components outside the TEM regime. The areas outside the TEM regime are referred to as non-TEM regions.

Verification of signal propagation within an actual integrated circuit typically involves decomposition of a signal into a set of Fourier components. As illustrated in FIG. 4, these components are distributed in several different regimes, where simplifying assumptions regarding any one regime cannot generally be applied to the actual step-function type signal. As an example, consider the signal illustrated in FIG. 4 propagating above a substrate whose resistivity is $10^{-4}$ ohm-m, which is made up of frequency components upto and including several gigahertz. As signals have components in multiple regimes, it is desirable to consider effects of multiple regimes in the complete verification of such a signal. This introduces significant computational complexity in verification of signal integrity. It is desirable to limit the number of cases to be calculated to those within the protocol constraints. Verification in such cases may also require large-scale computational techniques, such as those which are done on a supercomputer.

Standard circuit simulation does not consider these complex effects, which are traditionally calculated by use of large-scale computations. By limiting such computations to the reduced set of patterns which respect a protocol or by finding closed-form approximations to signals in various regimes, the computation of signal integrity becomes a practical engineering circuit signal simulation and verification tool.

The present invention provides a method of verifying signal integrity in an actual integrated circuit which incorporates both the logical and the electromagnetic characteristics of the circuit. By reducing the number of signal patterns to only those which occur within a predefined bus protocol space, the computational complexity of verification is greatly reduced. By developing a model incorporating up to all the terms of the Maxwell equations, it is possible to account for the effects of coupling electric and magnetic fields as well as the effects of substrate and/or displacement currents evidenced in the physical circuit. The present invention provides a method of more accurately verifying integrated circuit design, and in particular allows designers certainty in new designs to be used at ever increasing frequencies.

We claim:

1. A method for verifying a circuit design of an integrated circuit having a predetermined layout and designed to operate according to a protocol that specifies realizable states of the integrated circuit, the method comprising the steps of:

obtaining a physical description of the predetermined layout of the circuit;

selecting an electromagnetic model which includes at least one of inductive effects and substrate currents effects;

providing a simulator which provides a modeling input signal for use in simulation of the predetermined layout, the modeling input signal being representative of only realizable states;

applying the electromagnetic model, in conjunction with the modeling input signal, to the physical description of the predetermined layout to provide a fully simulated signal;

providing a protocol reference model signal representative of a desired signal; and comparing the protocol reference model signal to the fully simulated signal.

2. A method of manufacturing an integrated circuit utilizing the method of claim 1, further comprising the steps of:

designing the integrated circuit to include the circuit having the predetermined layout;

fabricating a set of masks for the integrated circuit which includes the circuit which has the predetermined layout; and fabricating the integrated circuit in conjunction with the set of masks.

3. The method of claim 1, wherein the electromagnetic model includes time-dependent portions of Maxwell's equations.

4. A method for verifying that an electrical interface circuit having a predetermined layout complies with a protocol, the method comprising the steps of:

obtaining a physical description of the predetermined layout of the electrical interface circuit;

providing a Boolean output which complies with the protocol;

applying an electromagnetic model that includes at least one of inductive effects and substrate current effects to the Boolean output and to the predetermined layout of the electrical interface circuit to produce a fully simulated signal;

providing a protocol reference model signal representative of a desired signal; and comparing the protocol reference model signal to the fully simulated signal.

5. The method of claim 4, wherein the Boolean output is limited to a number of patterns which is a subset of all possible Boolean combinations.

6. The method of claim 4, wherein the electromagnetic model is based on Maxwell's equations.

7. The method of claim 6, wherein the electromagnetic model includes time-dependent portions of Maxwell's equations.

8. The method of claim 6, wherein the electromagnetic model utilizes closed-form approximations to Maxwell's equations corresponding to a regime of operation.

9. The method of claim 4, wherein the electromagnetic model utilizes finite-difference time-domain computations.

10. A method for verifying that an electrical interface circuit having a predetermined layout for a limited set of valid logic signals, the method comprising the steps of:

obtaining a physical description of the predetermined layout of the electrical interface circuit;

providing a Boolean output that is one of the valid logic signals;

applying an electromagnetic model that includes inductive effects and substrate current effects to the Boolean output and to the predetermined layout of the electrical interface circuit to produce a fully simulated signal; and comparing the Boolean output to the fully simulated signal.

11. The method of claim 10, wherein the Boolean output is limited to a number of patterns which is significantly less than all possible Boolean combinations.

12. The method of claim 10, wherein the electromagnetic model is based on Maxwell's equations.

13. The method of claim 12, wherein the electromagnetic model includes time-dependent portions of Maxwell's equations.

14. The method of claim 12, wherein the electromagnetic model utilizes closed-form approximations to Maxwell's equations corresponding to a regime of operation.

15. The method of claim 10, wherein the electromagnetic model utilizes finite-difference time domain computations.

16. A method of manufacturing an integrated circuit utilizing the method of claim 10, further comprising the steps of:

designing the integrated circuit to include the electrical interface circuit which has the predetermined layout;

fabricating a set of masks for the integrated circuit which includes electrical interface circuit which has the predetermined layout; and fabricating the integrated circuit in conjunction with the set of masks.

17. A method of making an integrated circuit, comprising the steps of:

designing the integrated circuit to have a protocol and including therein an electrical interface circuit with a predetermined layout;

obtaining a physical description of the predetermined layout of the electrical interface circuit;

providing a Boolean output which complies with the protocol;

applying an electromagnetic model that includes at least one of inductive effects and substrate current effects to the Boolean output and to the predetermined layout of the electrical interface circuit of produce a fully simulated signal;

providing a protocol reference model signal representative of a desired signal; and comparing the protocol reference model signal to the fully simulated signal;

fabricating a set of masks according to a design of the integrated circuit which includes the electrical interface circuit; and fabricating the integrated circuit in conjunction with the set of masks.

18. The method of claim 17, wherein the fabricating the integrated circuit includes lithography steps.

19. A computer readable medium containing computer software for verifying that an electrical interface circuit which has a predetermined layout complies with a protocol, the computer software comprising:

a set of instructions for producing a Boolean output which complies with the protocol;

a set of instructions for applying an electromagnetic model that includes inductive effects and substrate current effects to a layout of the electrical interface circuit to produce a fully simulated signal in response to the Boolean output; and a set of instructions for comparing a protocol reference model representative of the protocol to the fully simulated signal.

20. A method of manufacturing the computer readable medium in claim 19 which comprises:

encoding the computer software in machine readable format on the computer readable medium.

21. A computer readable medium containing computer software for verifying that an electrical interface circuit which has a predetermined layout complies with a protocol, the computer software comprising:

a set of instructions for performing a logic simulation of the electrical interface circuit to produce a Boolean output;

a set of instructions for applying an electromagnetic model that includes at least one of inductive effects and substrate current effects to a layout of the electrical interface circuit to produce a fully simulated signal in response to the Boolean output; and a set of instructions for comparing the Boolean output to the fully simulated signal.

22. A method of manufacturing the computer readable medium in claim 21 which comprises:

encoding the computer software in machine readable format on the computer readable medium.

23. A method for verifying a circuit design of an integrated circuit having a predetermined layout and designed to provide an operating signal which operates within a limited number of possible outcomes, the method comprising the steps of:

obtaining a physical description of the predetermined layout of the circuit;

providing an electromagnetic model that comprises inductive effects and substrate effects in accordance with a complete form of Maxwell's equations in which electric and magnetic fields are coupled;

providing a reference signal as a representation of a desired signal of the integrated circuit in response to the operating signal;

providing a pattern simulation means for generating a simulated operating signal in a plurality of patterns, which patterns are within the limited number of possible outcomes, for use as a stimulus in modeling an operation of the integrated circuit and for use in providing the reference signal;

using the electromagnetic model, coupled to the physical description of the predetermined layout and the simulation input signal, to provide an EM-simulated signal as a representation of an actual signal of the integrated circuit; and comparing the reference signal to the EM simulated signal.

* * * * *

UNITED STATES PATENT AND TRADEMARK OFFICE
CERTIFICATE OF CORRECTION

PATENT NO.    : 6,106,567
DATED         : August 22, 2000
INVENTOR(S)   : Warren D. Grobman et al.

It is certified that error appears in the above-identified patent and that said Letters Patent is hereby corrected as shown below:

Claim 17, column 9, line 37, replace "of" with --to--.

Signed and Sealed this

First Day of May, 2001

Attest:

NICHOLAS P. GODICI

*Attesting Officer*    *Acting Director of the United States Patent and Trademark Office*